United States Patent
Angelsen et al.

(10) Patent No.: US 10,879,867 B2
(45) Date of Patent: Dec. 29, 2020

(54) MULTIPLE FREQUENCY BAND ACOUSTIC TRANSDUCER ARRAYS

(71) Applicants: Bjorn Atle Johan Angelsen, Trondheim (NO); Ola Finneng Myhre, Trondheim (NO)

(72) Inventors: Bjorn Atle Johan Angelsen, Trondheim (NO); Ola Finneng Myhre, Trondheim (NO)

(73) Assignee: SURF Technology AS, Trondheim (NO)

( * ) Notice: Subject to any disclaimer, the term of this patent is extended or adjusted under 35 U.S.C. 154(b) by 428 days.

(21) Appl. No.: 15/821,211

(22) Filed: Nov. 22, 2017

(65) Prior Publication Data
US 2018/0145654 A1    May 24, 2018

Related U.S. Application Data

(60) Provisional application No. 62/425,544, filed on Nov. 22, 2016.

(51) Int. Cl.
*H01L 41/09* (2006.01)
*H03H 9/02* (2006.01)
(Continued)

(52) U.S. Cl.
CPC ......... *H03H 9/02015* (2013.01); *B06B 1/064* (2013.01); *B06B 1/067* (2013.01);
(Continued)

(58) Field of Classification Search
CPC .......... H03H 9/02015; H03H 9/02062; H03H 9/02574; H03H 9/0014; B06B 1/0614; B06B 1/067; G10K 11/02
(Continued)

(56) References Cited

U.S. PATENT DOCUMENTS 3,952,216 A * 4/1976 Madison ............... B06B 1/0629
                                          310/325
4,373,143 A * 2/1983 Lindberg ............. G10K 11/343
                                          310/334
(Continued)

OTHER PUBLICATIONS

Ola F. Myhre, Johannes Kvam, and Bjorn A. J. Angelsen, "Dual Frequency Transducer Design for Suppression of Multiple Scattering", IEEE International Ultrasonics Symposium, pp. 1-4 (2016).
(Continued)

*Primary Examiner* — Thomas M Dougherty
(74) *Attorney, Agent, or Firm* — Cozen O'Connor (57) ABSTRACT

A structure of an acoustic transducer array probe for transmission of acoustic waves from a front radiation surface into an acoustic load material, where said acoustic waves can have frequencies in a high frequency (HF) band and further lower frequency (LF1, ..., LFn, ..., LFN) bands with $N \geq 1$, arranged in order of decreasing center frequency. The acoustic waves are transmitted from separate high and lower frequency arrays stacked together with matching layers in a thickness dimension into a layered structure, with at least a common radiation surface for said high and lower frequency bands. At least for said common radiation surface at least one lower frequency LFn electro-acoustic structure (n=1, ..., N) comprises a piezoelectric array with an acoustic isolation section to its front face. The acoustic isolation section includes to the front a section composed of a sequence of $L \geq 3$ matching layers with interchanging low and high characteristic impedances, where the front layer of said section is one of i) a lower characteristic impedance layer, and ii) a higher characteristic impedance layer, and where at least one lower characteristic impedance layer is made of a homogeneous material.

20 Claims, 6 Drawing Sheets

(51) Int. Cl.
*B06B 1/06* (2006.01)
*G10K 11/02* (2006.01)
*H03H 9/00* (2006.01)

(52) U.S. Cl.
CPC ............ *B06B 1/0614* (2013.01); *G10K 11/02* (2013.01); *H03H 9/02062* (2013.01); *H03H 9/02574* (2013.01); *H03H 9/0014* (2013.01)

(58) Field of Classification Search
USPC ................................. 310/320–322, 334–347
See application file for complete search history.

(56) References Cited

U.S. PATENT DOCUMENTS

| | | |
|---|---|---|
| 7,641,613 B2 | 1/2010 | Angelsen |
| 7,727,156 B2 | 6/2010 | Angelsen |
| 8,038,616 B2 | 10/2011 | Angelsen |
| 8,182,428 B2 | 5/2012 | Angelsen |
| 8,550,998 B2 | 10/2013 | Angelsen |
| 8,793,079 B2 | 7/2014 | Angelsen |
| 9,291,493 B2 | 3/2016 | Angelsen |
| 2002/0156379 A1 | 10/2002 | Angelsen et al. |
| 2003/0023169 A1 | 1/2003 | Angelsen et al. |
| 2007/0035204 A1* | 2/2007 | Angelsen ................ B06B 1/064 310/311 |
| 2014/0135681 A1 | 5/2014 | Angelsen |
| 2014/0150556 A1 | 6/2014 | Angelsen |
| 2017/0023667 A1 | 1/2017 | Angelsen |

OTHER PUBLICATIONS

Myhre et al., JASA 141 (2017), p. 1170-1179.
Preliminary Report on Patentability dated May 28, 2019 issued in International Patent Application No. PCT/IB2017/001548.
Myhre et al. "Dual Frequency Transducer Design for Suppression of Multiple Scattering," Sep. 18, 2016, pp. 1-4.
Search Report and Written Opinion dated May 8, 2018 which issued in the corresponding International Patent Application No. PCT/IB2017/001548.

* cited by examiner

MULTIPLE FREQUENCY BAND ACOUSTIC TRANSDUCER ARRAYS

CROSS REFERENCE TO RELATED APPLICATIONS

This application claims priority from U.S. Provisional Application No. 62/425,544, which was filed on Nov. 22, 2016, the entire content of which is incorporated herein by reference.

BACKGROUND OF THE INVENTION

1. Field of the Invention

The present invention is directed to technology and designs of efficient acoustic (sonic and ultrasonic) bulk wave transducers for operation in at least two frequency bands. Applications of the transducers are for example, but not limited to, medical ultrasound imaging and therapy, non-destructive testing, industrial and biological inspections, geological applications, and SONAR applications.

2. Description of the Related Art

U.S. Pat. Nos. 7,641,613, 8,038,616, 8,550,998, 8,793,079, 9,291,493 and US Pat Applications 2017/0023667, 2014/0150556 describe in depth different uses of dual band transmitted ultrasound and acoustic pulse complexes that provide images with reduced noise, images of nonlinear scattering, and quantitative object parameters that greatly enhance the use of ultrasound and acoustic imaging. The methods utilizes transmission of combined high frequency (HF) and low frequency (LF) acoustic pulses, and are applicable both with transmission and scatter imaging. The ratios of the center frequencies of the LF and HF pulses can typically be in the range >1:4, and at the same time the HF pulse must be found in defined intervals of the LF pulse throughout defined depth ranges of the images.

In other applications one wants to use the same probe for multi frequency acoustic therapy of tissue structures as for example cancer tumors, atherosclerosis, and skin wrinkles, also combined with ultrasound imaging. Ultrasound imaging would be used for visualization of the tissue structures, and also as guidance for steering the therapy beams against the structures.

A low frequency (e.g. 0.2-2 MHz) wave could for example be used for cavitation destruction of tissue, breakage of nano- or micro-particles or -bubbles to release encapsulated drugs, or stable oscillations of gas bubbles for improved drug transport, where a high frequency (e.g. 3-20 MHz) could be used for i) heating of the tissue for hyperthermia treatment, and ii) evaporation of nano- and micro-particles to form gas bubbles in tissue and iii) generate an ultrasound radiation force (URF) for improved transport of drugs as described in US Pat Appl 2014/0135681.

In yet another application one wants to have a probe for combined ultrasound treatment and imaging with 3 frequency bands, where for example a $2^{nd}$ lower frequency (LF2) band ~400 kHz is used for cavitation destruction of tissue, breakage of nano- or micro-particles or bubbles to release encapsulated drugs, or evaporation of nano- or micro-particles to form gas bubbles in tissue. A $1^{st}$ lower frequency (LF1) band ~3 MHz is used for heating or to generate an ultrasound radiation force, and a high frequency (HF) band ~20 MHz is used for imaging, potentially also in combination with the ~3 MHz LF1 band or a 400 kHz $2^{nd}$ low frequency (LF2) band for nonlinear manipulation of object elasticity for imaging according to the patents listed above.

In yet other applications one simply wants to have a larger selection of frequency bands available for imaging or treatment from the same probe for a large variation of depth ranges, for example in portable ultrasound imaging systems for emergency medicine. The arrays can for example be arranged as phased linear arrays, switched linear arrays, and curvilinear arrays. The need for multiband transducers is also found in many other applications of acoustic imaging, for example as in non-destructive testing (NDT) of materials, observations of geological formations with elastic waves, and SONAR measurements and imaging of fish, for example close to the sea bottom.

Solutions to dual and multi-frequency acoustic and ultrasound transducers are given in U.S. Pat. Nos. 7,727,156 and 8,182,428 using separate transducer layers for the different frequency bands in a stack with isolation sections between the different transducer layers, where each isolation section provides backwards isolation of waves from the transducer layer in front, and matching to the load of the transducer layer to the back.

The current invention provides solutions to detailed designs of the isolation sections for larger flexibility in selection of the different frequency bands.

SUMMARY OF THE INVENTION

The current invention provides a structure and design of an acoustic transducer array probe for transmission of acoustic waves from a front radiation surface into an acoustic load material, where said acoustic waves can have frequencies in a high frequency (HF) band and further lower frequency (LF1, . . . , LFn, . . . , LFN) bands with N≥1, arranged in order of decreasing center frequency. Said acoustic waves are transmitted from separate high and lower frequency arrays arranged as layers stacked together with matching layers in a thickness dimension into a layered structure, with at least a common radiation surface for said high and lower frequency bands.

At least for said common radiation surface at least one LFn, n=1, . . . , N, electro-acoustic structure for the lower frequency band comprises a piezoelectric array for electro-acoustic transduction in the LFn band, and an acoustic isolation section to its front face. Said acoustic isolation section provides backwards reflection of waves from the nearest transducer array to the front, and participates together with the structure of layers in front of the isolation section as acoustic matching of the LFn piezoelectric layer to the load material. Said acoustic isolation section includes to the front a section composed of a sequence of L≥3 matching layers with interchanging lower and higher characteristic impedances compared to the characteristic impedance of the array layer to the back in the same LF section, where the front layer of said section is one of i) a lower characteristic impedance layer, and ii) a higher characteristic impedance layer, and where at least one lower characteristic impedance layer is made of a homogeneous material, for example a polymer, or a homogenous mixture of polymers, or alike.

The two frontal layers of the isolation section is made with a thickness close to $\lambda_x/4$ where $\lambda_x$ is the wavelength in said matching layer at the frequency of the array for the next higher frequency band to the front of said isolation section. The thicknesses and characteristic impedances of the two frontal layers can be adjusted to obtain favorable frequency variation of the reflection coefficient into the front of the isolation section for the frequency band of the array in front of LFn, according to known methods.

The thickness of the further layers from the front of the isolation section can be adjusted more freely together with the characteristic impedances of these layers to obtain "spring-mass" resonant matching to the load for the LFn piezo-layer for a large range of frequencies LFn.

The invention specially focuses of 2-band arrays comprising a HF and a LF1 band with typical frequency ratios LF1:HF~1:4-1:30, and 3-band arrays comprising a HF, a LF1, and a LF2 band with typical frequency ratios LF1:HF~1:4-1:30 and LF1:LF2~1:4-1:30. For 3 and higher band arrays, the isolation section for at least one lower frequency band can comprise one of L=1 and L=2 layers.

The array for the HF band can be made as a piezoelectric array with forward acoustic matching to the load material, according to known methods. The HF array can also be made as cmut or pmut elements on a substrate, for example as described in U.S. Pat. Nos. 7,727,156 and 8,182,428. The LF1 array can also be made as cmut or pmut elements on the same substrate, as described in the same patents, albeit simpler manufacturing are found by using cmut or pmut elements for the HF array only, and piezoelectric arrays for the LF1 . . . LFN arrays.

One or more of the higher impedance layers can be made of a substrate including integrated electronic circuits that connects to array elements of at least one of the high frequency and lower frequency arrays, similar to what described in U.S. Pat. No. 8,182,428.

The invention also devices to use thermally conducting materials for at least one matching layer with thermal connection to an external cooling system, to cool the transducer structure for high power therapy or deep imaging applications. Other matching layers in the transducer structure can also be made of a material with high thermal conductivity and thermally connected to an external cooling system, for cooling of the transducer array structure.

To reduce lateral modes, the high impedance layers of the isolation section can be made as a composite of high and low impedance materials, according to known methods.

BRIEF DESCRIPTION OF THE DRAWINGS

In the drawings:

FIG. 1 shows in a) examples of low frequency (LF1) and high frequency (HF) pulse complexes useful for imaging, and in b) long burst waves useful for therapy that one wants to transmit.

DETAILED DESCRIPTION OF THE PRESENTLY PREFERRED EMBODIMENTS

Figure 1A:
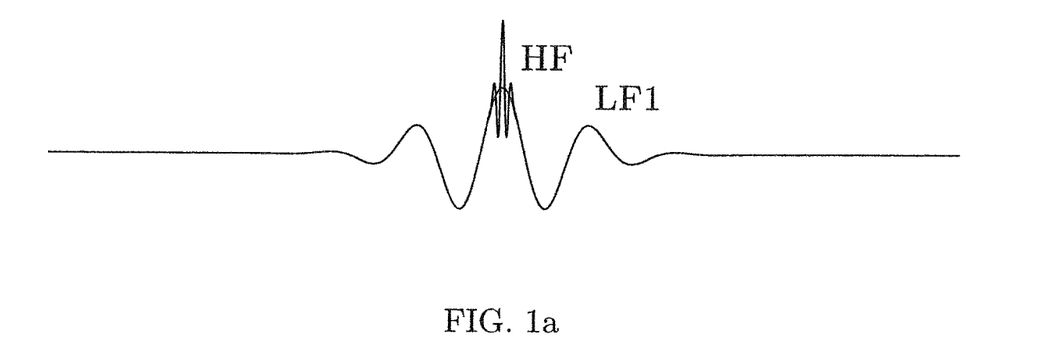
Figure 1B:
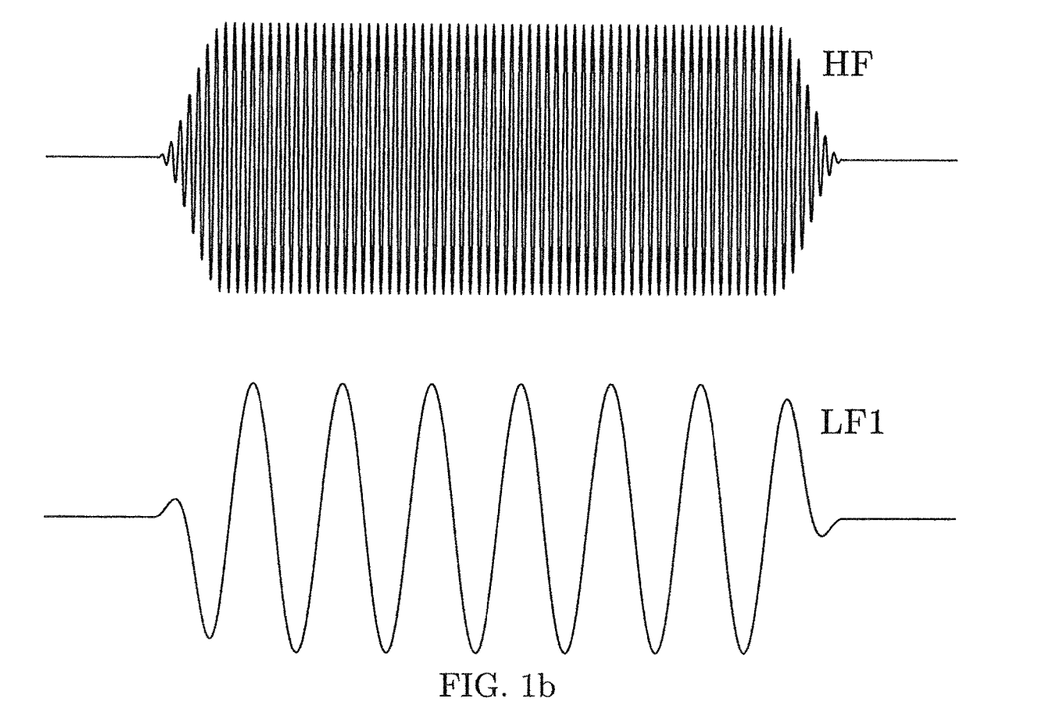

Example embodiments of the invention will now be described in relation to the drawings. Embodiments including dual and triple frequency arrays will be described, and the principles described therein are readily extended to more frequency bands. A typical example of a dual frequency pulse to be transmitted is shown in FIG. 1a as described above. FIG. 1b shows examples of therapy pulses transmitted in different frequency bands. The challenge in producing pulses with a specific frequency ratio lies in designing a vibration structure that allows transmission of a pulse in one of the frequency bands with center frequency LF1, . . . , LFn, . . . , LFN, and a HF pulse, where the ratio between the HF and chosen low frequency bands LF1, . . . , LFn, . . . , LFN is given. The present invention provides solutions to this problem.

Figure 2:
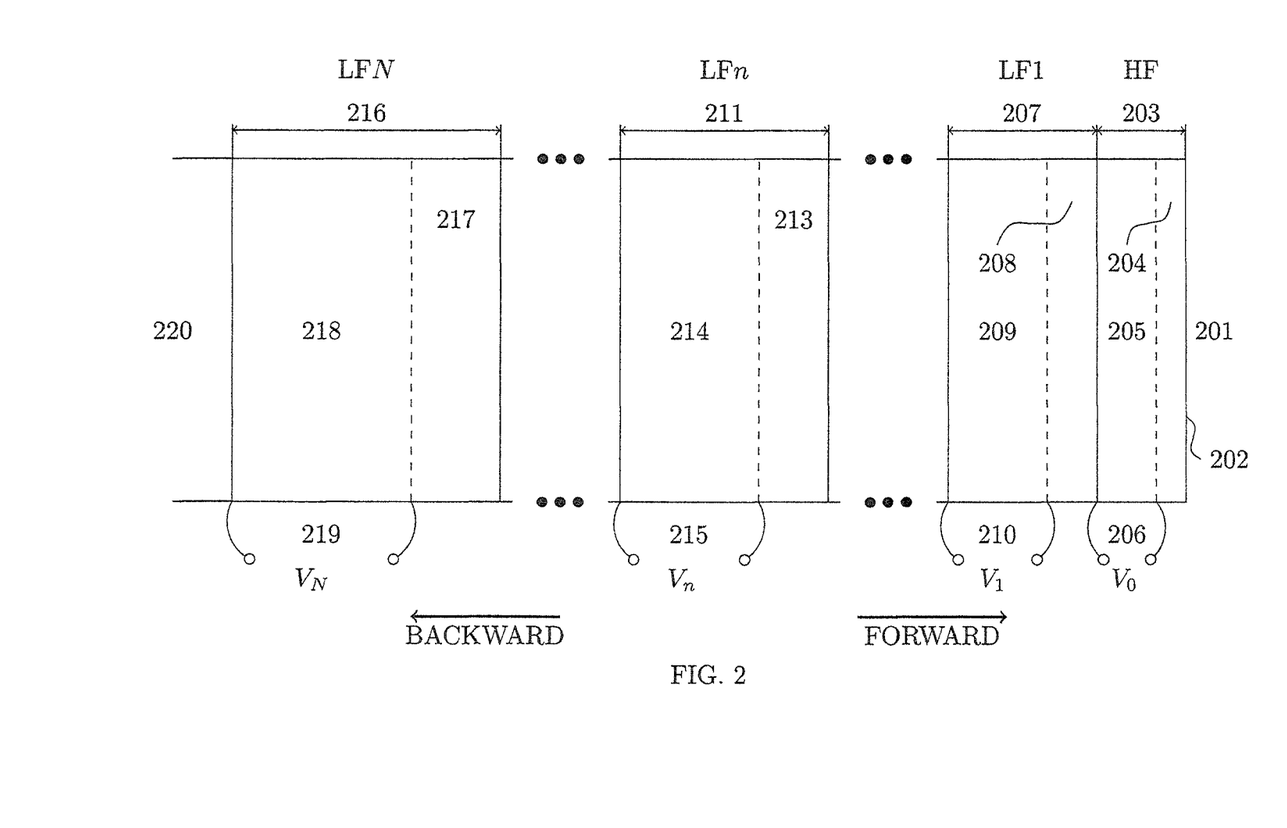
FIG. 2 shows the general structure of the cross section of an acoustic stack in an acoustic transducer array probe containing transducers and acoustic matching structures that enable transmission in a high frequency (HF) band and further lower frequency (LF, . . . , LFN) bands.

FIG. 2 shows the general structure of an acoustic stack consisting of a high frequency (HF) electro-acoustic transducer structure 203 and N lower frequency (LF) electro-acoustic transducer structures, all of which are stacked in a thickness direction, where LFN<LF(N−1)< . . . <LF1<HF, and where all the different frequency transducer structures share at least a partially common radiation surface 202 that radiates into a common loading material 201, as described in U.S. Pat. Nos. 7,727,156 and 8,182,482. Each of the electro-acoustic transducer structures, 203, 207, 211, 216 contain a HF and LF1 . . . LFN electro-acoustic transducer array 205, 209, 214, 218, with an associated electrical port 206, 210, 215, 219, and an acoustic matching structure to the front of the electro-acoustic transducer array 204, 208, 213, 217. The purpose of the acoustic matching structures 204, 208, 213, 217 is to provide acoustic matching to the load for the transducer array to the rear of the matching structure, and to prevent waves within the frequency band of the transducer structure immediately in front of the matching structure from being transmitted backwards beyond the matching structure through one or both of reflection from or absorption in the matching structure. These acoustic matching structures are in the following referred to as isolation sections.

Figure 3:
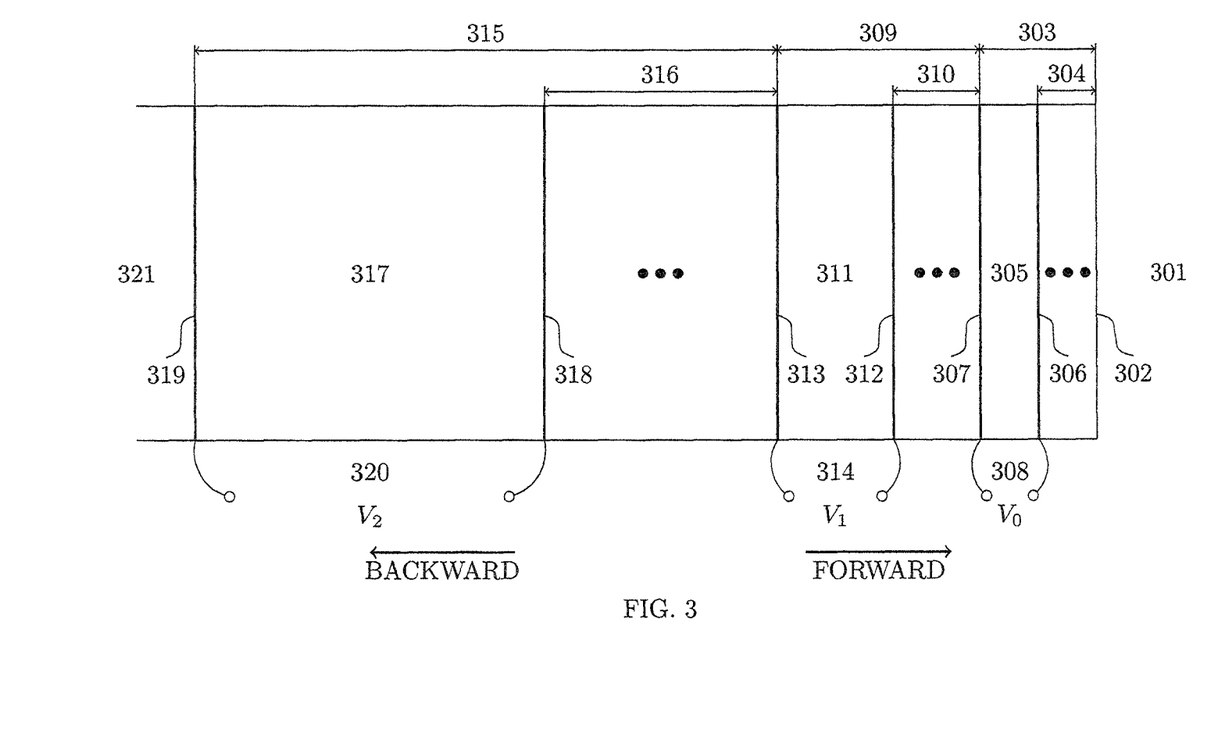
FIG. 3 shows a cross section of a dual and a triple piezo-layer stack arrangement according to the invention that allows transmission and reception of a two and three frequency band pulses through a common front face.

FIG. 3 shows an example of a stack of piezoelectric and acoustic layers that is a reduced form of the structure in FIG. 2, and allows the transmission and reception of HF, LF1 and LF2 pulses through a common radiation surface 302 that is in contact with a load material 301.

The HF pulse is generated and/or received by the HF transducer array structure 303, which, in this embodiment is composed of a HF piezoelectric layer 305 that is resonant in the HF band, with an HF acoustic matching structure 304 that connects the HF piezoelectric material acoustically to the loading material. The HF array can also be made as cmut or pmut elements on a substrate, for example as described in U.S. Pat. Nos. 7,727,156 and 8,182,482. The HF matching structure 304 may consist of one or multiple layers of material, according to known methods. The HF piezoelectric layer has a set of HF electrodes, 306 and 307, on the front and back faces that electrically define the array elements. These electrodes constitute an HF electrical port, 308, which may be driven by an electrical signal to transmit pulses in the HF band, and/or may be monitored for voltage signals that result from pressure waves in the HF band being incident on the HF piezoelectric plate, 305.

The LF1 pulse is in this embodiment generated by the LF1 transducer array structure 309, which is composed of an LF1 piezoelectric layer 311 that is resonant in the LF1 band, and an LF1 isolation section 310 to the front which functions as a forward acoustic matching structure in the LF1 band, and connects the LF1 piezoelectric material acoustically to the loading material. The LF1 isolation section is also designed so that it has a high reflection of backwards HF waves into the section, so that it minimizes HF vibrations from backwards propagating HF waves stack from the HF transducer array structure, 303, into the further backwards transducer structure. The LF1 piezoelectric layer has a set of LF1 electrodes, 312 and 313, on the front and back faces that electrically define LF1 array elements. These electrodes constitute an LF1 electrical port, 314, which may be driven by an electrical signal to transmit acoustic pulses in the LF1 band, and/or may be monitored for voltage signals that result from pressure waves originating in the load material 301 in the LF1 band being incident on the LF1 piezoelectric plate, 311.

The LF2 pulse is generated and/or received by the LF2 transducer array structure 315, which, in this embodiment, is composed of a LF2 piezoelectric layer 317 that is resonant in the LF2 band and an LF2 isolation section 316 to the front which provides reflection (isolation) of backwards waves in the LF1 band to propagate further backwards in the transducer structure, and functions together with the other layers to the front as a forward acoustic matching structure for waves from the LF2 array 317 in the LF2 band to the load 301. The LF2 piezoelectric layer has a set of LF2 electrodes, 318 and 319, on the front and back-faces that electrically defines the LF2 array elements. These LF2 electrodes constitute for each element an LF2 electrical port, 320, which may be driven by an electrical signal to transmit acoustic pulses in the LF2 band, and/or may be monitored for voltage signals that result from pressure waves in the LF2 band being incident on the LF2 piezoelectric plate, 317.

The purpose of the isolation sections 310 and 316 in FIG. 3 is to i) prevent the propagation of HF/LF1 pulses from the HF/LF1 assemblies 303/309 into the layers behind the isolation sections, and ii) to provide together with the layers in front of each isolation section acoustic matching for the LF2/LF1 piezoelectric layers to the loading material within the LF2/LF1 bands. This example will focus on the isolation section 310, but it should be obvious to anyone skilled in the art that the following design considerations and principles are also applicable to the isolation section 316, and any further backwards isolation sections as described in FIG. 2. In the following, it will be assumed that the characteristic impedance of the loading material is low compared to the characteristic impedances of the piezoelectric layers in the transducer structure, 305, 311, and 317, as is the case in for example medical and SONAR applications. It should however be clear to anyone skilled in the art how the structures in 310 and 316 could be modified for certain non-destructive material testing or other, where the load material impedance is higher than that of 305, 311, and 317.

To prevent backwards propagation of HF pulses from the HF transducer structure 303, the reflection coefficient between the HF transducer structure 303 and the LF1 isolation section 310 should be as close to unity as possible. This is achieved when the impedance seen into the LF1 isolation section 310 from the front face of the isolation section is either high or low compared to the characteristic impedance of the material constituting the HF electro-acoustic transduction layer. When the impedance seen into the LF1 isolation section 310 is low compared to the characteristic impedance of the material constituting the HF piezoelectric layer 305, the HF piezoelectric layer will operate at half-wave resonance. Similarly, when the impedance seen into the LF1 isolation section 310 is high compared to the characteristic impedance of the material constituting the HF piezoelectric layer 305, the HF piezoelectric layer will operate at quarter-wave resonance.

Figure 4:
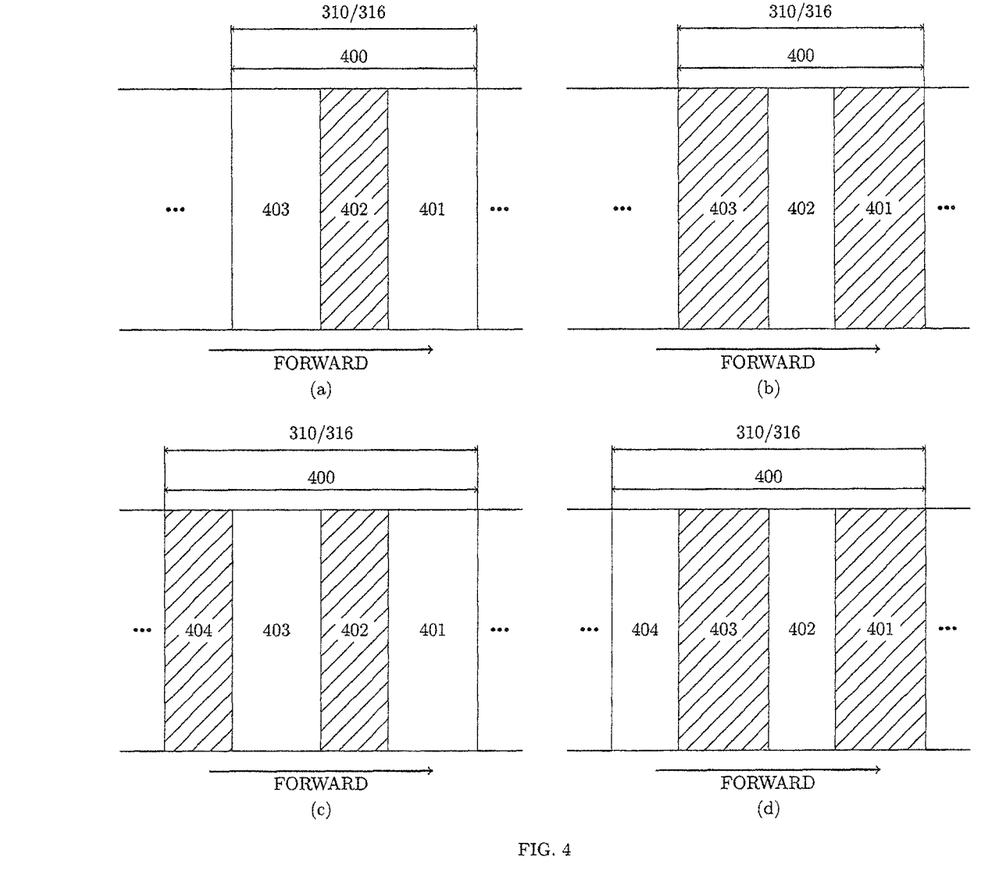
FIGS. 4a-4d show examples of other layer structures that participate in the isolation of the piezo-electric sections in FIG. 3.

Letting the LF1 isolation section 310 comprise L layers of material, of which K≤L have thicknesses corresponding to a quarter wave-length of the HF pulse, the impedance seen into the front face of the LF1 isolation section 310 at the HF is given by the equation $$Z_{HF}^B(L) = \begin{cases} Z_K^B \dfrac{\prod_{k=1}^{K/2} Z_{2k-1}^2}{\prod_{k=1}^{K/2} Z_{2k}^2}, & K \text{ even} \\ \dfrac{1}{Z_K^B} \dfrac{\prod_{k=1}^{(K+1)/2} Z_{2k-1}^2}{\prod_{k=1}^{(K-1)/2} Z_{2k}^2}, & K \text{ odd} \end{cases} \quad (1)$$

where $Z_k$ is the characteristic impedance of the k'th layer of material counted from the front of the isolation section, and $Z_K^B$ is the acoustic impedance seen towards the back of the acoustic stack from the back face of the K'th isolation layer in the isolation section. FIG. 4.a-d shows four examples of how the isolation sections 310 and/or 316 may be constructed from multiple layers of materials.

Equation (1) shows that when the number of layers with quarter-wave thickness in the isolation section 310, K, is an odd number, the impedance seen backwards into the front face of the isolation section 310 can be made low compared to the characteristic impedance of the HF piezo-layer by letting the odd-numbered isolation layers, e.g. 401 and 403 in FIG. 4a, be comprised of a material with low characteristic impedance compared to that of the LF1 piezo-layer (for example RTV-11, RTV-577, low density polyethylene (LDP), butyl rubber, bakelite, polypropylene, polystyrene, polyamid, vinyl, stycast 1267, mylar, lucite, PMMA, acrylic, epoxy, or PVC), and letting the even-numbered isolation layers, e.g. 402 in FIG. 4a, be comprised of a material with high characteristic impedance compared to that of the LF1 piezo-layer (for example a heavy metal such as Cu, Ag, Pt, W, Au, Fe, Ti, or a semiconducting material such as Germanium, Silicon, or GaAs, or a composite material such as carbon fiber or graphite). This gives a half-wave resonance of the HF piezo-layer.

One will in the following denote a material of an isolation section with low or high characteristic impedance as defined in relation to the characteristic impedance of the nearest piezo-layer array to the back of said isolation section. A high or low impedance into an isolation section from its front is defined in relation to the nearest electro-acoustic transduction layer to the front of said isolation section.

One will in the following denote a material of an isolation section with low or high characteristic impedance as defined in relation to the characteristic impedance of the nearest piezo-layer array to the back of said isolation section. A high or low impedance into an isolation section from its front is defined in relation to the nearest electro-acoustic transduction layer to the front of said isolation section.

The materials with high characteristic impedance might have a high shear stiffness which may result in coupling between thickness vibration modes wanted for good electroacoustic transducer operation, and lateral shear modes of vibration that causes dysfunction of the transducer. The shear modes can be suppressed by making the layers with high characteristic impedance as for example 1-3 or 2-2 composites of high/low or low/high characteristic impedance materials, according to known methods.

The layers in the isolation section 310 and the HF transducer structure 303 therefore constitute a mass-spring system at the LF1 which, in combination with the radiation impedance into the loading material 301 defines the acoustic impedance seen forwards towards the load from the front face of the LF piezoelectric layer 311. For the LF2, the mass-spring system comprises the layers of the HF transducer structure, 303, the layers of the LF1 transducer structure, 309, and the layers of the isolation section 316. For an acoustic stack containing N LF transducers where LF1>LF2> . . . >LFN, as in FIG. 2 the resonance frequency of the mass-spring system loading LFn is approximately given by the equivalent spring constants, $k_n$, and equivalent mass, $m_n$, of the layers between the LFn piezoelectric layer and the loading material 201, as $$f_n = \frac{1}{2\pi}\sqrt{\frac{k_n}{m_n}} \quad (2)$$

In the embodiment containing an LF1 transducer structure 309 and a HF transducer structure 303, the resonance frequency of the acoustic impedance seen into the back face of the isolation section 310 from the LF1 piezoelectric layer 311 can be described in terms of the thicknesses and characteristic impedances of the layers in the isolation section 310 and the HF transducer structure 303, as shown in more detail by Myhre et al., JASA 141 (2017), p. 1170. The thickness of each layer is defined in terms of the fractional thickness relative to the HF wavelength, so that the thickness of layer i is $d_i = v_i \lambda_H$, where $\lambda_H$ is the wavelength at the HF. The HF transducer structure 303 has an equivalent characteristic impedance which is the thickness-weighted sum of the characteristic impedance of the layers in the HF transducer structure 303, i.e. $\hat{Z}_H = \Sigma_j v_j Z_j$.

The acoustic impedance seen forward into the back face of the isolation section 310 can be described by the circuits of masses). In FIG. 5a and FIG. 5c the first isolation layer, counted from the front, is a layer with low characteristic impedance, whereas in FIG. 5b and FIG. 5d the first isolation layer, counted from the front, is a layer with high characteristic impedance. In FIG. 5a and FIG. 5b there are an odd number of isolation layers, whereas in FIG. 5c and FIG. 5d, the number of isolation layers is even. The term $Z_R$ is the radiation impedance into the load material, the inductance $L_H = 2\pi \hat{Z}_H / \omega_H$, and the other inductances and capacitances are defined as $$L_n = \frac{2\pi}{\omega_H} v_n Z_n = \frac{2\pi}{\omega_H} \hat{Z}_n \quad (3)$$

$$C_n = \frac{2\pi}{\omega_H}\left(\frac{v_n}{Z_n} + \frac{v_{n-1}}{2Z_{n-1}} + \frac{v_{n+1}}{2Z_{n+1}}\right) = \frac{2\pi}{\omega_H} \hat{Y}_n Y_n \quad (4)$$

Figure 5:
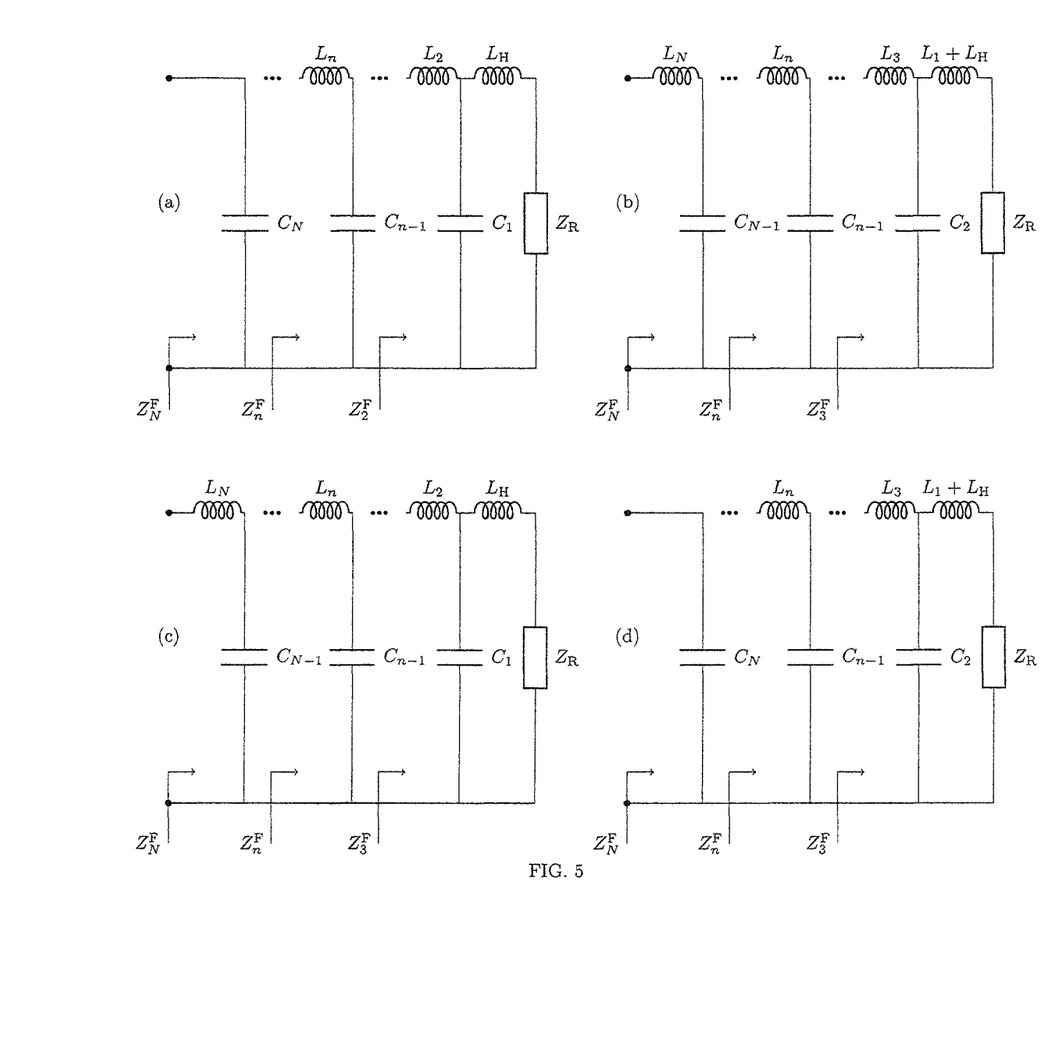
FIGS. 5a-5d show equivalent electrical circuits which describe how the layer structures of FIG. 4 react to passing waves that have a wavelength that is much larger than the thickness of said layers.

The general form of the acoustic impedance seen forwards into the back face of the isolation section 310 is, by analysis of FIG. 5, $$Z_N^{Fa}(\omega) = \frac{j\omega L_{N-1} + Z_{N-2}^{Fa}(\omega)}{1 + j\omega C_N(j\omega L_{N-1} + Z_{N-2}^{Fa}(\omega))} \quad (5a)$$

$$Z_N^{Fb}(\omega) = \frac{j\omega L_N + Z_{N-2}^{Fb}(\omega)(1 - \omega^2 L_N C_{N-1})}{1 + j\omega C_{N-1} Z_{N-2}^{Fb}(\omega)} \quad (5b)$$

As shown by FIGS. 4b, 4d, 5b, 5d, when the first isolation layer 401 has a high characteristic impedance, the mass of said layer can be added to the total mass of the HF transducer structure 303, so that the foremost inductance in FIGS. 5b, 5d is $L_H + L_1$.

Equations (5a) and (5b) are recursive, and it is enlightening to develop more specific formulae for when the total number of layers in the isolation section is set or known, as in Myhre et al., JASA 141 (2017), p. 1170. For example, considering the isolation section structure in FIG. 4a, and it's associated equivalent circuit form in FIG. 5a, the impedance seen forwards into the back face of the isolation structure 310 is $$Z_3^{Fa}(\omega) = \frac{Z_R(1 - \hat{\omega}^2 \hat{Z}_2 \hat{Y}_1 Y_1) + j\hat{\omega}\hat{Z}_H(\zeta_T - \hat{\omega}^2 \hat{Z}_2 \hat{Y}_1 Y_1)}{1 + j\hat{\omega}\hat{Z}_2 \hat{Z}_R Y_T\left(\frac{1+Y_R}{\hat{Z}_2 \hat{Y}_3 Y_3} - \hat{\omega}^2\right) - \hat{\omega}^2 \hat{Z}_2 \hat{Z}_H Y_T\left(\frac{1+\zeta_T Y_R}{\hat{Z}_2 \hat{Y}_3 Y_3} - \hat{\omega}^2\right)} \quad (6)$$

$$\hat{\omega} = \frac{2\pi\omega}{\omega_H}$$

$$\zeta_T = 1 + \frac{\hat{Z}_2}{\hat{Z}_H}$$

$$Y_R = \frac{\hat{Y}_3 Y_3}{\hat{Y}_1 Y_1}$$

$$Y_T = \hat{Y}_1 Y_1 \hat{Y}_3 Y_3$$

in FIG. 5. Layers with low characteristic impedance are shown as capacitors (equivalent of springs), layers with high characteristic impedance are shown as inductors (equivalent It subsequently follows from evaluating the poles of Equation (6) that the resonance of the mass-spring system occurs at $$\hat{\omega}_3 \approx \frac{1}{\sqrt{2\hat{Z}_2 \hat{Y}_3 Y_3}} \left( 1 + \zeta_T Y_R - \sqrt{(1+\zeta_T Y_R)^2 - 4\frac{\hat{Z}_2}{\hat{Z}_H} Y_R} \right)^{1/2} \quad (7)$$

Setting $\hat{Y}_3 = 0$ is equivalent to removing the third isolation layer 403, which results in a mass-spring resonance frequency of $$\hat{\omega}_2 \approx \frac{1}{\sqrt{2\hat{Z}_2 \hat{Y}_1 Y_1}} \left( 1 + \zeta_T + 2\frac{\hat{Y}_1}{\hat{Y}_2} \right)^{1/2} \quad (8)$$

and, similarly, setting $\hat{Z}_2 = 0$, $\hat{Y}_2 = 0$, is equivalent to removing the second isolation layer 402, leaving a single layer 401, which results in a mass-spring resonance frequency of $$\hat{\omega}_1 \approx \frac{1}{\sqrt{2\hat{Z}_H \hat{Y}_1}} \quad (9)$$

For the acoustic impedance seen backwards into the front face of the isolation section 310 to be low when using a single isolation layer 401 in the isolation section 310, the thickness of the isolation layer 401 should be close to a quarter wavelength at the HF, and the characteristic impedance should be low, according to Equation (1), under the assumption that the acoustic impedance seen backwards into the LF piezoelectric layer 311 is high. Thus, it follows that $\hat{Z}_H$ and $\hat{Y}_1$ are fixed by consideration of the HF transducer structure 303, and the LF1 operates most efficiently at a frequency given by $\hat{\omega}_1$.

Using an isolation section 310 with two layers 401, 402 with alternating high and low characteristic impedances opens for tuning of the thicknesses in the two layers. Equation (1) shows that, for the acoustic impedance seen backwards into the front face of the isolation section 310 to be low when using two isolation layers 401, 402, it is convenient that both layers are close to a quarter wavelength of the HF. The thicknesses may also be selected to obtain adequate backwards reflection coefficient at the rear face of the HF piezoelectric layer 305 according to other known methods. However, the thicknesses will in any case be on the order of a quarter wavelength at the HF, and the parameters controlling $\hat{\omega}_2$ are therefore, as with $\hat{\omega}_1$, fixed by consideration of the HF transducer structure 303. The LF1 operates most efficiently at a frequency given by $\hat{\omega}_2$.

When using three layers of material in the isolation section, 401, 402, 403, and letting the two first layers 401, 402 have thicknesses of a quarter wavelength at the HF, the thickness of the third isolation layer 403 can be around a quarter wavelength at the HF, which gives a very low acoustic impedance seen backwards into the front face of the isolation section 310. With L=3 in Equation (1), using for example copper and polyimide in the layers with high and low characteristic impedance, respectively, $Z_{HF}^B(3) = Z_P^2 / 225 Z_3^B$, where typically $Z_P^2 / Z_3^B < 1$ MRayl since the characteristic impedance of the LF1 piezoelectric layer 311, $Z_{LF}$, dominates the impedance $Z_3^B$. Increasing the thickness of the third isolation layer 403 to half a wavelength at the HF $Z_{HF}^B(3) = Z_2^B / 225$, where the acoustic impedance $Z_2^B$ is dominated by the characteristic impedance of the LF piezoelectric layer 311, $Z_{LF}$.

Further increasing the thickness of the third isolation layer 403 causes the impedance $Z_{HF}^B(3)$ to fall in between these values. Finally, when the thickness of the third isolation layer 403 is larger than half the pulse length of the transmitted HF pulse, the acoustic impedance seen backwards into the isolation section 310, as observed by the pulse, is $Z_{HF}^B(3) = Z_P / 225$, due to the lack of interference between the reflected waves from the front and back faces of the isolation layer 403. Inserting any of these calculated acoustic impedances into the formula for the backward reflection coefficient at the rear face of the HF piezoelectric layer 305, $\Gamma_3 = (Z_{HF}^B(3) - Z_{HF}) / (Z_{HF}^B(3) + Z_{HF})$, where $Z_{HF} \sim Z_{LF} > Z_p$ is the characteristic impedance of the HF piezoelectric layer 305, results in $\Gamma_3 \approx 1$.

The resonance frequency of the mass spring relation in Equation (7) is approximately inversely proportional to the thickness of the third isolation layer 403, since $\hat{Y}_3 = v_3 / Z_3$, where $v_3 = d_3 / \lambda_H$ and $d_3$ is the thickness. The resonance can therefore, following the preceding discussion, be tuned by adjusting the thickness of the third isolation layer 403, while maintaining $\Gamma_3 \approx 1$. With L=1 and L=2 the resonance can be tuned by adjusting the thickness of the isolation layers 401 and 402, at the expense of letting $\Gamma_1 \neq 1$ and $\Gamma_2 \neq 1$.

Note that this tuning ability is not a special case for L=3, but rather for L≥3. The number of layers in the isolation section 310 can be increased in principle ad infinitum for further flexibility in tuning the resonance of the mass-spring interaction in front of the LF piezoelectric layer 311, provided that the first two layers 401 and 402 of the isolation section 310 satisfy the condition that $\Gamma_1 \approx 1$, for example via using layers with thicknesses of a quarter wavelength at the HF, as shown by Equation (1).

Figure 6:
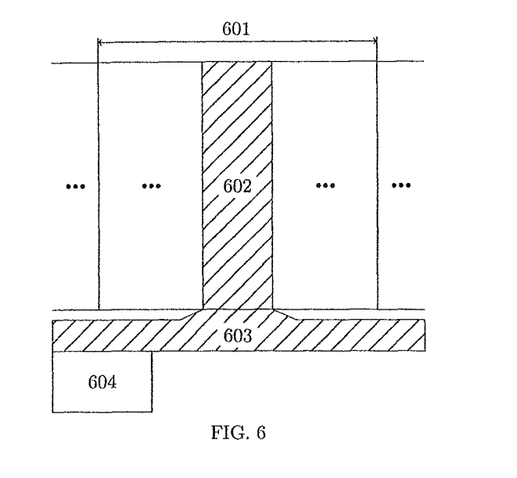
FIG. 6 shows an example of how the layer structures of FIGS. 2-4 can be utilized to drain heat from the transducer array probe.

Acoustic layers of the isolation sections with high thermal conductivity may also be used in a cooling system for the transducer probe for increased acoustic power transmission, for example for acoustic therapy or increased depth of acoustic imaging. FIG. 6 shows an example 601 is any one of the isolation sections in FIGS. 2-4. The layer 602 is a layer comprising a material with high thermal conductivity. The layer is thermally connected to a heat conducting structure 603, which is connected to a cooling device 604 that removes heat from the structure. The heat conducting structure can for example be a direct extension of the layer with high thermal conductivity 602, with potentially an increase in cross section for improved thermal conductivity. It is also obvious to anyone skilled in the art that any number of matching layers from the whole transducer structure with adequately high thermal conductivity may be connected to the heat conducting structure 603.

We should note that FIGS. 2-4 are designed to show the thickness structure of the transducer probe as it typically is within the region of common radiation area for the different frequency bands, and are not intended to give an indication of the dimension of array elements for the different frequency bands. It is the intention that each layer as shown and described in FIGS. 2-4 comprises several elements of the arrays, where the lateral width of the elements generally increases essentially by inverse proportion of the central frequency of the array, with added conditions of required steering of focus and beam direction for the different frequency arrays. By example, the HF beam is generally dynamically focused, while a lower frequency beam can be fixed focused or unfocused, which allows the array for said lower frequency to be composed of a single element. The piezoelectric layers of the transducer structure are preferably made as ceramic/polymer composites known in the art, or any other acousto-electric transduction material existing or developed in the future.

In most cases it is also advisable for production and other reasons, to keep the same thickness structure also outside the common radiation surface area, where the total width of the transducer structure is determined by the width of the array with the largest radiation surface area, and defining the smaller radiation surface areas of arrays at other frequencies by electrical connection to element electrodes of said array. Further, the structure may be curved in one or two directions, as can be understood by anyone skilled in the art.

It is also expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. An acoustic transducer array probe for transmission of acoustic waves from a front radiation surface of the probe into a load material, where said waves can be transmitted within separate high frequency (HF) and one or more lower frequency (LF1, . . . , LFn, . . . , LFN) bands, in order of decreasing center frequency where N≥1, and where each said high and lower frequency bands are generated with separate high and lower frequency arrays stacked together with acoustic matching layers in a thickness dimension into a layered structure with the HF array to the front, followed backwards by the lower frequency arrays in sequence of decreasing frequency LF1, . . . , LFn, . . . , LFN, and where the radiation surfaces for said high and lower frequency bands have a common area of the probe radiation surface where also radiation surfaces for one or more frequency bands can extend outside the radiation surfaces for at least one other frequency band, and where at least for said common area the electro-acoustic structure for at least one lower frequency band LFn, n=1, . . . , N, comprises a piezoelectric array for electro-acoustic transduction in the LFn band, and an acoustic isolation section to its front, where said acoustic isolation section provides backwards isolation of waves generated by the transducer array to the front for the nearest higher frequency band, and participates together with the probe structure layers in front of the isolation section as acoustic matching of the LFn piezoelectric layer to the load material, and where said acoustic isolation section includes a front part composed of a sequence of L≥3 matching layers with interchanging lower and higher characteristic impedances compared to the characteristic impedance of the nearest piezo-layer to the back, where the front layer of said front part is one of i) a low characteristic impedance layer, and ii) a high characteristic impedance layer, and where at least one of said lower characteristic impedance layers of said front part is made of a material with characteristic impedance <4 MRayl.

2. The acoustic transducer array probe according to claim 1, where each lower frequency array is made of an electro-acoustic structure comprising a piezoelectric layer for electro-acoustic transduction and an acoustic isolation section to its front, where said acoustic isolation section provides backwards isolation of waves generated by the transducer array to the front for the nearest higher frequency band, and participates together with the probe structure layers in front of the isolation section as acoustic matching of the piezoelectric layer to the load material, and where at least one acoustic isolation section comprises one of L=1 and L=2 matching layers with interchanging lower and higher characteristic impedances compared to the characteristic impedance of the nearest piezo-layer to the back, where the front layer of said front part is one of i) a lower characteristic impedance layer, and ii) a higher characteristic impedance layer.

3. The acoustic transducer array probe according to claim 1, where the thicknesses of the two frontal matching layers of said front part are close to $\lambda_x/4$ where $\lambda_x$ is the wavelength in said matching layer at the frequency of the array for the next higher frequency band to the front of said isolation section.

4. The acoustic transducer array probe according to claim 2, where the thickness of the front matching layers of said at least one acoustic isolation section is close to $\lambda_x/4$ where $\lambda_x$ is the wavelength in said matching layer at the frequency of the array for the next higher frequency band to the front of said isolation section.

5. The acoustic transducer array probe according to claim 1, where the thicknesses and characteristic impedances of the two frontal matching layers of said front part are adjusted for a desired frequency variation of the backwards reflection coefficient into said isolation section within the frequency band of the array for the next higher frequency band to the front of said isolation section.

6. The acoustic transducer array probe according to claim 2, where the thicknesses and characteristic impedances of the matching layers of said at least one isolation section are adjusted for a desired frequency variation of the backwards reflection coefficient into said at least one isolation section within the frequency band of the array for the next higher frequency band to the front of said at least one isolation section.

7. The acoustic transducer array probe according to claim 1, where the thicknesses and characteristic impedances of the two frontal matching layers of said front part of the isolation section are selected so that these layers comprises together with other layers to the front, a spring-mass resonance within the frequency band of the nearest piezo-layer to the back of said isolation section.

8. The acoustic transducer array probe according to claim 2, where the thicknesses and characteristic impedances of the matching layers of said at least one isolation section are selected so that these layers comprises together with other layers to the front, a spring-mass resonance within the frequency band of the nearest piezo-layer to the back of said isolation section.

9. The acoustic transducer array probe according to claim 1, where the thicknesses and characteristic impedances of the third and higher layers from the front of the isolation section are selected so that these layers comprises together with other layers to the front a spring-mass resonance within the frequency band of the nearest piezo-layer to the back of said isolation section.

10. The acoustic transducer array probe according to claim 1, where at least one of said higher characteristic impedance layers of said isolation section are made as a composite of material with high and low characteristic impedance to reduce lateral modes in the structure.

11. The acoustic transducer array probe according to claim 2, where a layer with higher characteristic impedance of said at least one isolation section is made as a composite of material with high and low characteristic impedance to reduce lateral modes in the structure.

12. The acoustic transducer array probe according to claim 1, where the array for the HF band comprises a piezoelectric array.

13. The acoustic transducer array probe according to claim 1, where the array for said HF band comprises one of a cmut and pmut array.

14. The acoustic ultrasound transducer according to claim 1, where at least one of said higher characteristic impedance layers are made of a substrate with integrated electronic circuits that connects to array elements of at least one of the high frequency and lower frequency arrays.

15. The acoustic ultrasound transducer according to claim 2, where at least one of said higher characteristic impedance layers are made of a substrate with integrated electronic circuits that connects to array elements of at least one of the high frequency and lower frequency arrays.

16. The acoustic ultrasound transducer according to claim 1, where at least one of said higher characteristic impedance layers are made of a material with high thermal conductivity, and thermally connected to an external cooler, for cooling of the transducer array structure.

17. The acoustic ultrasound transducer according to claim 2, where at least one of said higher characteristic impedance layers are made of a material with high thermal conductivity, and thermally connected to an external cooler, for cooling of the transducer array structure.

18. The acoustic ultrasound transducer according to claim 1, where other matching layers in the transducer structure are made of a material with high thermal conductivity and thermally connected to an external cooling system, for cooling of the transducer array structure.

19. The acoustic ultrasound transducer according to claim 1, where absorption in said isolation section is a dominating effect for said backwards isolation.

20. The acoustic ultrasound transducer according to claim 2, where absorption in said at least one acoustic isolation section is a dominating effect for said backwards isolation.

* * * * *